United States Patent
Forey et al.

(10) Patent No.: US 9,742,551 B2
(45) Date of Patent: Aug. 22, 2017

(54) SERDES WITH HIGH-BANDWITH LOW-LATENCY CLOCK AND DATA RECOVERY

(71) Applicant: INPHI CORPORATION, Santa Clara, CA (US)

(72) Inventors: Simon Forey, Northamptonshire (GB); Parmanand Mishra, Cupertino, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/162,402

(22) Filed: May 23, 2016

(65) Prior Publication Data

US 2017/0078084 A1 Mar. 16, 2017

Related U.S. Application Data

(63) Continuation of application No. 14/853,912, filed on Sep. 14, 2015, now Pat. No. 9,374,217.

(51) Int. Cl.
| | |
|---|---|
| *H03D 3/24* | (2006.01) |
| *H04L 7/033* | (2006.01) |
| *H03L 7/087* | (2006.01) |
| *H03M 9/00* | (2006.01) |

(52) U.S. Cl.
CPC ............ *H04L 7/0331* (2013.01); *H03L 7/087* (2013.01); *H04L 7/033* (2013.01); *H03M 9/00* (2013.01)

(58) Field of Classification Search
CPC ......... H04L 7/033; H04L 7/0008; H04L 7/02; H04L 7/0331; H04L 7/0337; H03L 7/0891; H03L 7/093; H03L 7/087; H03L 7/18
USPC ........ 375/376, 375, 373, 354, 316, 295, 219
See application file for complete search history.

(56) References Cited

U.S. PATENT DOCUMENTS

| | | | | |
|---|---|---|---|---|
| 6,377,082 | B1* | 4/2002 | Loinaz | H03K 5/19 327/156 |
| 7,512,204 | B1* | 3/2009 | Foroudian | G06F 13/4045 375/376 |
| 2012/0216084 | A1* | 8/2012 | Chun | H04L 25/02 714/708 |
| 2012/0269305 | A1* | 10/2012 | Hogeboom | H04L 25/069 375/346 |
| 2015/0043628 | A1* | 2/2015 | Rane | H04L 25/03019 375/232 |

* cited by examiner

*Primary Examiner* — Zewdu Kassa
(74) *Attorney, Agent, or Firm* — Richard T. Ogawa; Ogawa P.C.

(57) ABSTRACT

The present application is directed to data communication. More specifically, embodiments of the present invention provide a SerDes system that includes multiple communication lanes that are aligned using a clock signal. Each of the communication lanes comprises a receiver, a buffer, and a transmitter. The receiver uses multiple sampling lanes for data sampling and clock recovery. Sampled data are stored at the buffer and transmitted by the transmitter. There are other embodiments as well.

20 Claims, 6 Drawing Sheets

SERDES WITH HIGH-BANDWITH LOW-LATENCY CLOCK AND DATA RECOVERY

CROSS REFERENCE PARAGRAPH

The present application is a continuation of and claims priority to U.S. application Ser. No. 14/853,912 filed Sep. 14, 2015, the contents of which are incorporated herein by reference.

BACKGROUND OF THE INVENTION

The present invention is directed to data communication.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, serializer/deserializer ("SERDES" or "SerDes") with clock and data recovery modules are often used.

Over the past, there have been many types of communication systems and methods.

Unfortunately, they have been inadequate for various applications. More specifically, sense amplifiers are often inadequate. Therefore, improved systems and methods are desired.

BRIEF SUMMARY OF THE INVENTION

The present application is directed to data communication. More specifically, embodiments of the present invention provide a SerDes system that includes multiple communication lanes that are aligned using a clock signal. Each of the communication lanes comprises a receiver, a buffer, and a transmitter. The receiver uses multiple sampling lanes for data sampling and clock recovery. Sampled data are stored at the buffer and transmitted by the transmitter. There are other embodiments as well.

According to an embodiment, the present invention provides a SerDes system. The system includes a reference clock. The system also includes a first communication lane configured to process a first data stream at a first data rate and transmitting a first sampled data stream using an output clock signal. The first data stream is characterized by a first data rate. The system also includes a second communication lane configured to process a second data stream at a second data rate and transmitting a second sampled data stream. The system additionally includes an interface management module configured to provide control signals. The first communication lane comprises a receiver module comprising a sampling module and a PLL. The receiver is configured to sample the first data stream. The sampling module includes a first sampling line and a second sampling line. The first sampling line is configured to provide sampling the first data stream at a second data rate. The second data rate is a fraction of the first data rate. The first communication lane also includes a FIFO buffer that is configured to store sampled data from the receiver module. The first communication lane additionally includes a transmission module that is configured to transmit the first sampled data stream at a output data rate.

According to another embodiment, the present invention provides a SerDes system that includes a reference clock. The system also includes a first communication lane configured to process a first data stream at a first data rate and transmitting a first sampled data stream using an output clock signal. The first data stream is characterized by a first data rate. The system also includes a second communication lane configured to process a second data stream at a second data rate and transmitting a second sampled data stream. The system additionally includes an interface management module configured to provide control signals. The first communication lane comprises a receiver module, which has a sampling module and a PLL and is configured to sample the first data stream. The sampling module includes a first sampling line and a second sampling line. The first sampling is configured to provide sampling the first data stream at a second data rate. The second data rate is a fraction of the first data rate. The first sampling line comprises a sense amplifier and a charge pump. The first communication lane also includes a transmission module that is configured to transmit the first sampled data stream at a output data rate.

According to yet another embodiment, the present invention provides a SerDes system includes a first communication lane configured to process a first data stream at a first data rate and transmitting a first sampled data stream using an output clock signal. The first data stream is characterized by a first data rate. The system also includes a second communication lane configured to process a second data stream at a second data rate and transmitting a second sampled data stream. The system additionally includes an interface management module configured to provide control signals. The first communication lane comprises a receiver module, which has a sampling module and a PLL and is configured to sample the first data stream. The sampling module has a first sampling line and a second sampling line. The first sampling line is configured to provide sampling of the first data stream at a second data rate. The second data rate is at a fraction of the first data rate. The first sampling line comprises a sense amplifier and a charge pump. The first sampling line and the second sampling line are time-interleaved based on a predetermined alignment. The PLL is configured to provide a recovered clock signal based at least on the first data stream. The first communication lane also includes a transmission module being configured to transmit the first sampled data stream at a output data rate.

It is to be appreciated that embodiments of the present invention provide many advantage over conventional systems and techniques. By using time-interleaved sampling and CDR with reference clock, low-latency and high-bandwidth performance can be achieved. Additional, embodiments of the present invention are compatible with existing systems, and can be implemented and manufactured using existing tools and processes. There are other advantages as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope 25 of the claims herein.

One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
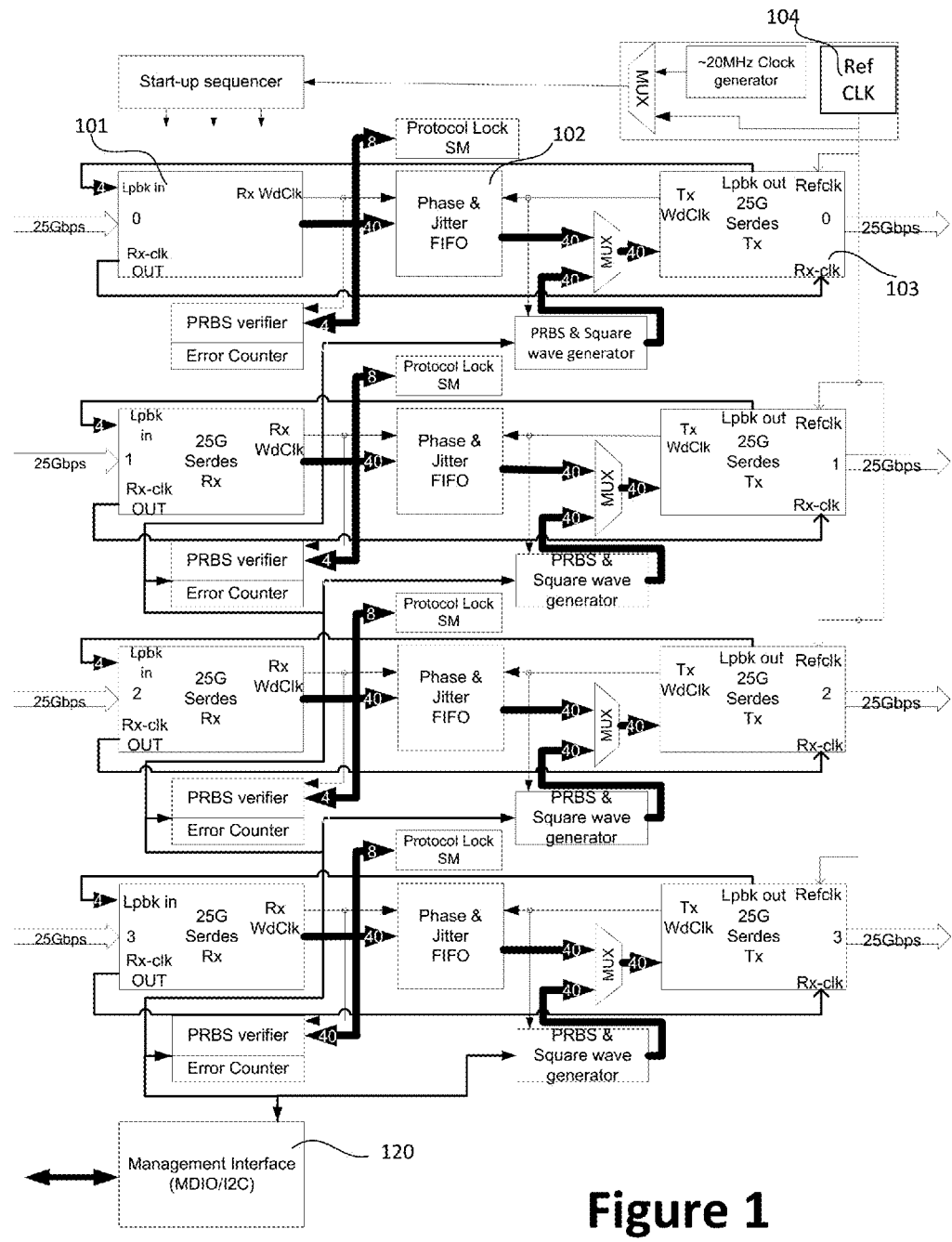
FIG. 1 is a simplified block diagram illustrating a SerDes according to an embodiment of the present invention.

The present application is directed to data communication. More specifically, embodiments of the present invention provide a SerDes system that includes multiple communication lanes that are aligned using a clock signal. Each of the communication lanes comprises a receiver, a buffer, and a transmitter. The receiver uses multiple sampling lanes for data sampling and clock recovery. Sampled data are stored at the buffer and transmitted by the transmitter. There are other embodiments as well.

One of the challenges in data communication is providing high-speed and low-latency clock and data recovery (CDR). Typically, input data that needs to be processed by a SerDes is often at a high bandwidth (e.g., 25 Gbps, as described in the 25 GbE standard), but the speed at which it can be processed (e.g., sampled with a recovered clock) is limited by the processing speed of the receiving module. For example, in an optical data communication system, a SerDes provides a processing interface between a high speed data source (e.g., data storage) and an optical communication link. In various embodiments, the present invention provides a CMOS, lane-independent 10-30 Gbps reference clock-less SerDes used within 100 Gbps quad CDR or gearbox applications.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

As mentioned above, embodiments of the present invention provide a SerDes system for data communication. FIG. 1 is a simplified block diagram illustrating a SerDes according to an embodiment of the present invention. This diagram is merely an example, which should not unduly limit the scope of the claims. One of ordinary skill in the art would recognize many variations, alternatives, and modifications. As can be seen in FIG. 1, the SerDes system includes four communication lanes, a receiver, a buffer, and a transmitter. For example, the communication lane on the top includes receiver 101 that receives incoming data at a rate of 25 Gbps. Among other things, receiver 101 includes time-interleaved samplers and charge pumps that allow incoming data to be processed in parallel. In various embodiments, to support per lane asynchronous/synchronous operations and a wide frequency range, a per-lane receiver phase lock loop (PLL) and per-lane transmitter PLL architecture is used in the reference clock-less CDR. The receiver (e.g., receiver 101) equalizes the data and receiver PLL recovers the clock from data without a reference clock to assist initial locking. For example, a common reference clock 104 is used by transmitters of the communication lanes, not used by the receivers for performing CDR. Multi-lane CDRs are used for various application, as each communication lane operating asynchronously and (or even) different data rate dictates the need of having independent receiver and transmitter PLLs per lane. The recovered clock signal is used for sampling the incoming data, and the sampled data are stored at the buffer 102. Additionally, the recovered clock signal from the receiver is send to the transmitter's PLL for jitter cleaning and the serial data is regenerated by the transmitter. Buffer 102 can be implemented using a first-in-first-out buffer that aligns the data sampled by the receiver 101 and removes jitters as needed. For example, buffer 102 comprises a digital FIFO that is configured between used between the receiver 101 and transmitter 103 to remove dynamic skew in synchronous operations. It is to be appreciated that one of the major challenges in PLL-per-lane architecture is the suppression of electrical/magnetic cross-talk. To manage the cross-talk, a combination of VCO topology selection, detailed management of package/chip level substrate routing, on-chip decoupling, supply isolation and voltage regulation with improved mid-high band supply rejection, and/or other techniques are adopted. A MDIO and I2C interface 120 provides control of transmitter and receiver and selection of diagnostic and debug modes. A free running low frequency relaxation oscillator provides a low-accuracy functional clock to the digital logic.

Figure 2:
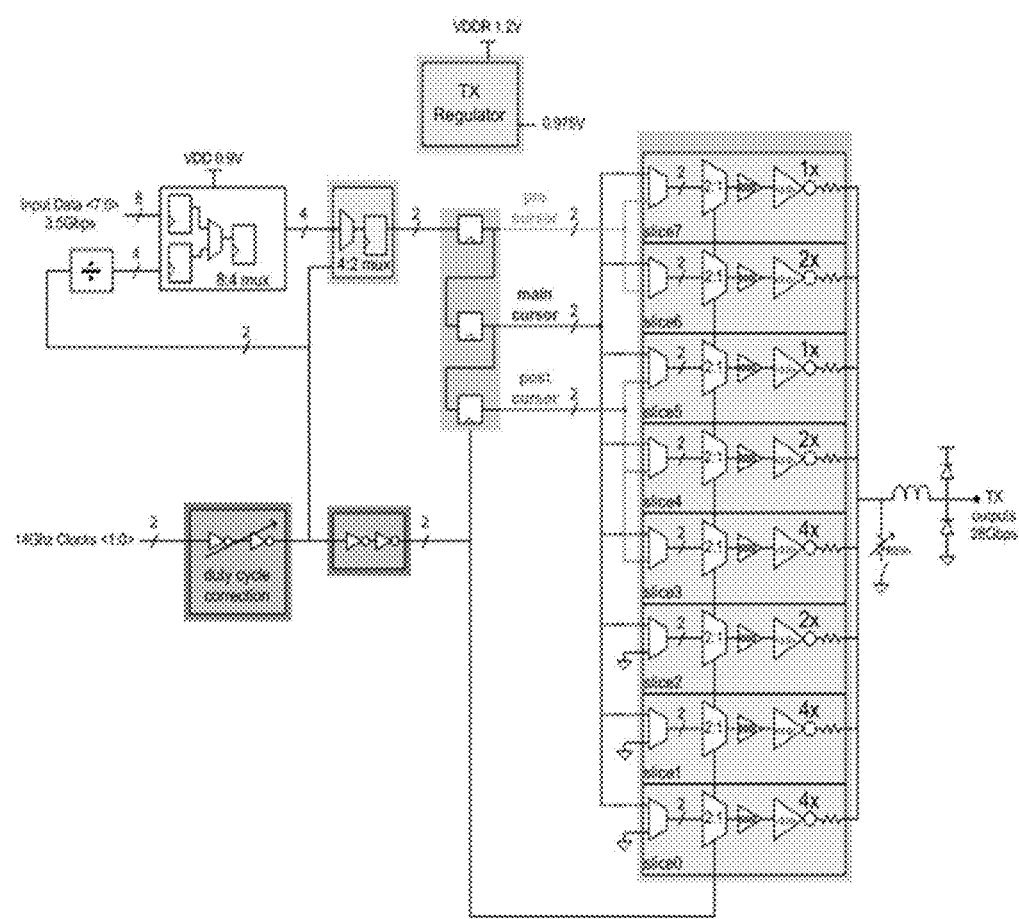
FIG. 2 is a simplified diagram illustrating a transmitter according to an embodiment of the present invention.

It is to be appreciated that transmitter 103 as shown in FIG. 1 can be implemented in various ways. FIG. 2 is a simplified diagram illustrating a transmitter according to an embodiment of the present invention. This diagram is merely an example, which should not unduly limit the scope of the claims. One of ordinary skill in the art would recognize many variations, alternatives, and modifications. More specifically, the transmitter illustrated in FIG. 2 has a half-rate asynchronous architecture. Eight streams of data at 3.5 GHz are multiplexed into a 14.0 GHz data-pair that is subsequently interleaved into a 28 Gbs data-steam using two PLL clock phases. A narrow band LC-VCO based PLL is used for jitter cleaning and clock phase generation. Analog duty cycle correction is used to minimize deterministic jitter on the transmitter output. The output stage is implemented as multiple instances of a smaller, basic structure providing multiple swing settings and a 3-tap FIR filter with eight levels of post-cursor and four levels of pre-cursor de-emphasis. The de-emphasis provides a high-pass filter function to compensate for line losses and the maximum levels of de-emphasis are 15% (pre-cursor) and 35% (post-cursor), with 5% resolution. These ranges are generous providing compatibility with existing receivers without integrated equalization. The line driver is voltage mode to minimize power consumption and has a trimmed series termination including an on-chip inductor to optimize high-frequency return loss (<−10 dB at 10 GHz with package). The line-driver and inter-leaver stages are fed from separate regulators to minimize both board-level noise injection and self-induced supply disruption. Two regulators are used to isolate data dependent noise contributions from the clocking circuitry and large cyclo-stationary noise sources (clock buffers) from the main data-path, and to reduce coupling between PLL lanes running at different data-rates.

As shown in FIG. 1, the transmitter processes the data sampled by the receiver and transmits them at 25 Gbps per communication lane, which is a very high speed and thus puts a high demand on the processing sampling speed of the receiver. According to various embodiments, receives comprises an interleaved sampling block to provide a high-bandwidth low-latency CDR. The receiver utilizes a reference clock-less, quarter rate, ring oscillator based PLL, which provides digital frequency locking and digital skew correction (between data and edge clock sampling strobes for low power) within a clock recovery loop that can meet the 100 GE, 100GBASE-LR4 and OTL4.4 jitter tolerance requirements (e.g., 5 UI at 100 kHz and 0.05 UI at 10 MHz). Depending on the implementation, skew correction can be implemented in various ways, such as the techniques described in the U.S. patent application Ser. No. 14/715,494, filed 18 May 2015, entitled "SKEW CORRECTION FOR SERDES RECEIVERS", which is incorporated by reference herein. For example, frequency acquisition without reference clock is described in U.S. patent application Ser. No. 14/696,326, filed 24 Apr. 2015, entitled "FREQUENCY ACQUISITION FOR SERDES RECEIVERS", which is incorporated by reference herein. The receiver also comprises DAC control delay cells to create the systematic programmable delay between data and edge clocks. The PLL of the receiver uses a digital loop for integral path and an analog loop for the proportional path. The receiver PLL uses a ring-VCO (instead of LC-VCO) to support the broad tuning range and to minimize PLL pulling/coupling. The receiver PLL generates four quadrature 7.0 GHz phases for 28 Gbs operation. The receiver's quadrature phase error is calibrated with a digital algorithm on startup. In various embodiments, T-Coils and calibrated resistive terminations are used to optimize the return loss.

In various implementations, the receiver PLL uses a regulator to reduce cyclo-stationary jitter contributions (PLL and clock generators) only. The receiver equalizes 10 Gbps-28 Gbps serial data with programmable peaking and programmable frequency. A PLL locks onto the data edges present in the post equalized eye. In each lane, 4 data samplers, 4 edge samplers and 1 eye-scan sampler are used at 7 GS/s in a quarter-rate configuration. Additional circuitry is used to implement non-destructive, asynchronous eye-scan diagnostics.

Figure 3A:
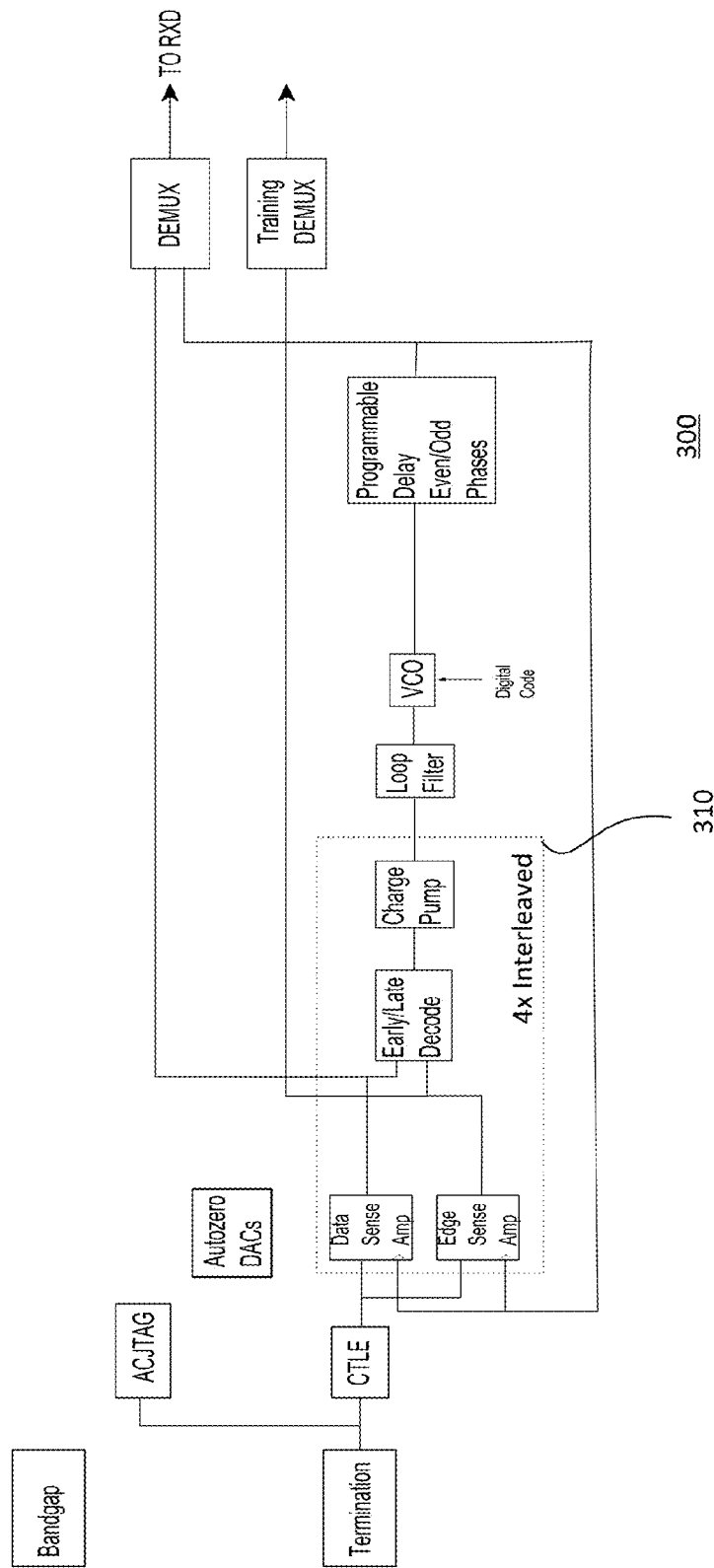
FIG. 3A is a simplified diagram illustrating a receiver according to an embodiment of the present invention.

FIG. 3A is a simplified diagram illustrating a receiver according to an embodiment of the present invention. This diagram is merely an example, which should not unduly limit the scope of the claims. One of ordinary skill in the art would recognize many variations, alternatives, and modifications. As shown in FIG. 3A, receiver 300 includes a terminal for receiving incoming data. For example, terminal is connected to a data communication link or data source (e.g. hard drive), which may include optical communication link, data bus, or other types of communication lines. Terminal is connected to the continuous time linear equalization (CTLE) module. For example, the CTLE may be implemented as an equalizer module. As an example, an "output" of a CTLE typically includes a positive output and a negative output, as a pair of outputs. The CTLE is connected to sampling block 310, which is time-interleaved. Additionally, CTLE is connected to a DEMUX module, which provides a digital output. In various embodiments sense amplifiers are corrected using CTLE, as described in the U.S. patent application Ser. No. 14/798,308, filed 13 Jul. 2015, entitled "OFFSET CORRECTION FOR SENSE AMPLIFIER WITH CONTINUOUS TIME LINEAR EQUALISER", which is incorporated by reference herein. According to various implementations, sampling block 310 includes four sets of interleaved sets of sense amplifier, early/late detector, and charge pump.

Figure 3B:
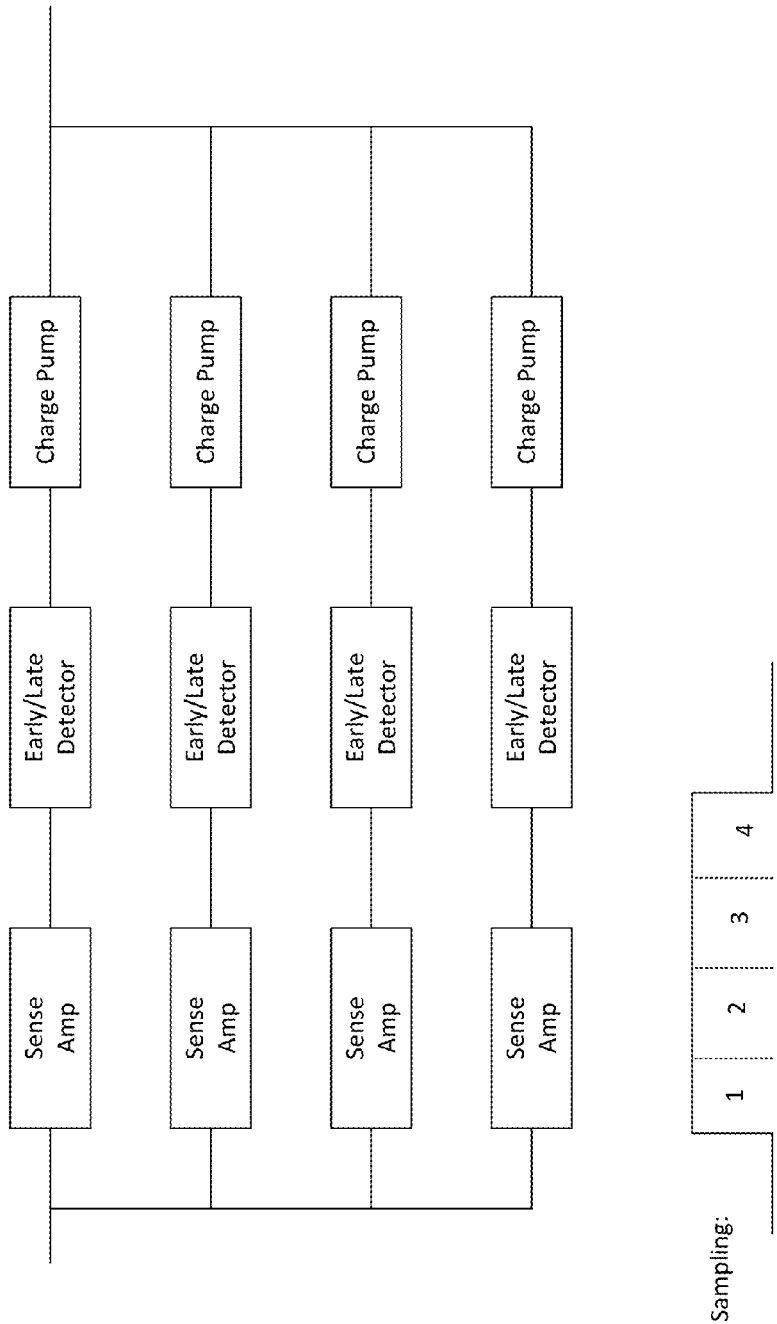
FIG. 3B is a simplified diagram illustrating an interleaved sampling block according to an embodiment of the present invention.

FIG. 3B is a simplified diagram illustrating an interleaved sampling block according to an embodiment of the present invention. This diagram is merely an example, which should not unduly limit the scope of the claims. One of ordinary skill in the art would recognize many variations, alternatives, and modifications. As shown in FIG. 3B, the sampling block 310 includes four sampling lanes, and each of the sampling lanes comprises a sense amplifier, an early/late detector, and a charge pump. Sampling typically involves two or more samplers. For example, sense amplifier of each lane may include a data sense amplifier and an edge data amplifier, where the data sense amplifier is used for data sampling, and edge sense amplifier is configured for edge sampling. It is to be understood the data sense amplifier and the edge sense amplifier together amplify data received from the equalizer module. The sense amplifier is connected to the early/late detector. The detector, or sometimes referred to as "early/late detection module", is configured to determine whether the incoming data is early or late, which is typically measured in phase. For example, the early/late detector comprises shift detection mechanisms for determining whether the incoming signal is sampled early or late. As mentioned above, incoming data (e.g., received from the input terminal in FIG. 3A) are usually at high rate (e.g., 25 Gbps, 28 Gbps, or even higher), which is difficult to process and provide CDR. By interleaving sampling to four lanes (different numbers of lanes are possible as well), a sampling rate can be used. For example, for incoming data at 28 GHz, each of the sampling lanes only needs to operate at 7 GHz. For example, for a sampling window afforded by a 7 GHz frequency, each of the four lanes respectively samples at their corresponding sampling position 1, 2, 3, and 4 as shown, effectively sampling at 28 GHz when operating in a time-interleaved manner. Sampling alignment and data hold are provided by the early/late detector and charge pump of each lane. In various embodiments, sampling sequence and alignment are predetermined. For example, the VCO coupled to the sampling block provides delays for spacing of the sampling process, and the respective early/late detectors provide alignment as needed. Depending on the actual sampling frequency, the spacing of sampling windows among the four sampling lanes can be adjusted during a startup calibration process. For example, the VCO receives a digital code regarding the sampling frequency.

Now referring back to FIG. 3A. In various embodiments, loop filter, VCO, and programmable delay module are a part of a PLL that is configured to provide clock signal recovery. The output of the PLL comprises a recovered clock signal that is provided to data sense amplifier and the edge sense amplifier as shown. Data sampled by the sense amplifiers and are provided to the DEMUX module. Additionally, the recovered clock signal generated by the PLL is used during the data transmission process, as the recovered clock signal corresponds to the data sampled by the sense amplifiers.

The recovered data is then to be transferred at an output clock frequency, which is different from frequency of the recovered clock signal. To do so, the transmission (TX) driver may be used transfers output data at the output clock frequency provided by the transmission (TX) PLL. In various embodiments, the TX PLL provides frequency multiplying, where the output clock frequency can be much higher than frequency of the recovered clock signal. For example, the transmission driver is implemented as a part of the transmitter shown in FIG. 2.

Figure 4:
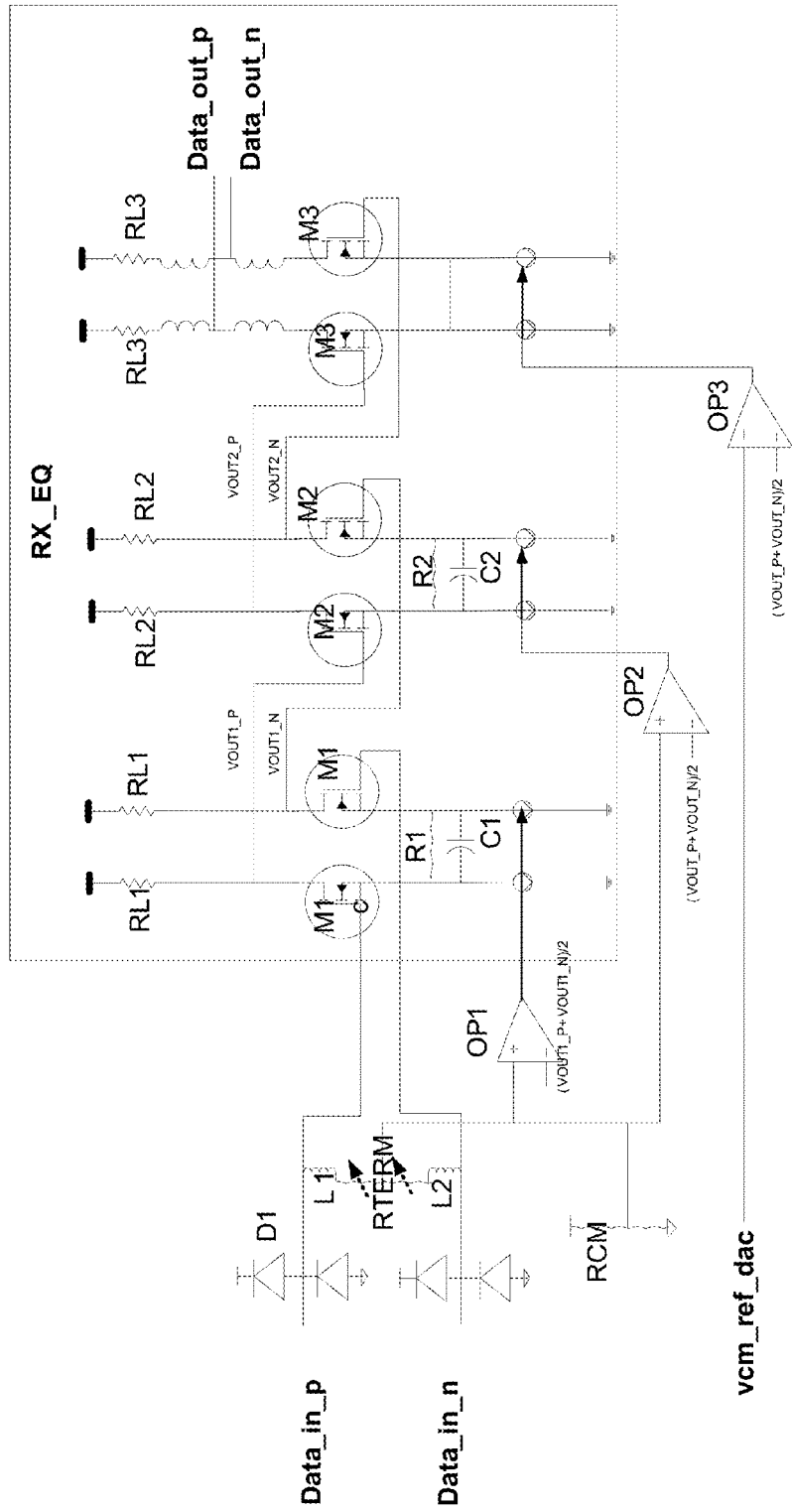
FIG. 4 is a simplified diagram illustrating an equalizer according to an embodiment of the present invention.

FIG. 4 is a simplified diagram illustrating an equalizer according to an embodiment of the present invention. This diagram is merely an example, which should not unduly limit the scope of the claims. One of ordinary skill in the art would recognize many variations, alternatives, and modifications. As shown in FIG. 4, an equalizer has three cascaded gain stages with configurable pole-zero locations and bandwidth, producing ~20 dB of gain-peaking at about 14 GHz. The first two stages of the CTLE are used for peaking and third stage is used as limiting amplifier. A continuous-time linear equalizer (CTLE), adjustable by two capacitors and two resistors, provides adequate equalization for without suffering the power penalty of a decision feedback equalizer (DFE). Common-mode feedback (CMFB) is used to independently bias both equalizer stages. Offset calibration is applied to both equalizer stages and the data-samplers. A programmable reset sequencer selects the offset calibration mode and initiates auto-zeroing. The equalization adaptation algorithm is digital continuous-time and minimizes the post-cursor contributions to the symbol response whilst compensating for the temperature dependence of the channel loss and receiver front-end by tuning capacitors C1, R1, C2 and resistor R2. For example, CTLE equalization is described in U.S. patent application Ser. No. 14/679,934 filed 6 Apr. 2015, entitled "CONTINUOUS TIME LINEAR EQUALIZATION FOR CURRENT-MODE LOGIC WITH TRANSFORMER", which is incorporated by reference herein. In certain embodiments, CTLE provides rate programming described in the U.S. patent application Ser. No. 14/681,989, filed 8 Apr. 2015, entitled "DATA RATE PROGRAMMING USING SOURCE DEGENERATED CTLE", which is incorporated by reference herein.

Figure 5:
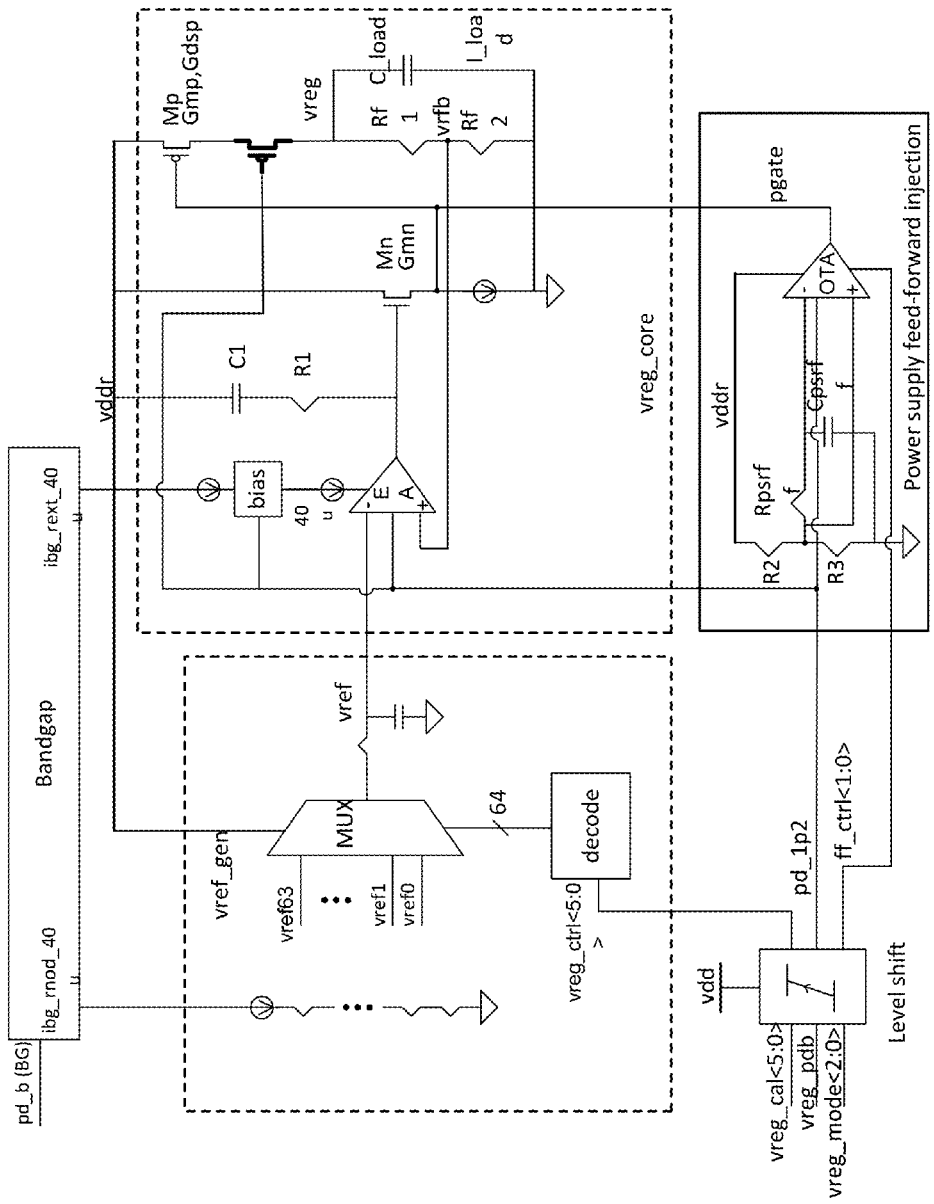
FIG. 5 is a simplified diagram illustrating a power management system according to an embodiment of the present invention.

According to various embodiments, the SerDes system illustrated in FIG. 1 comprises a power management system. For example, the power management system provides regulator power supply rejection (PSRR), which is important to reducing deterministic jitter in a high speed CMOS SerDes. FIG. 5 is a simplified diagram illustrating a power management system according to an embodiment of the present invention. This diagram is merely an example, which should not unduly limit the scope of the claims. One of ordinary skill in the art would recognize many variations, alternatives, and modifications. For example, the power management system is implemented for operating with receivers and transmitters of the SerDes system. In various embodiments, the power management system utilizes CMOS based low drop-out regulator with high frequency feed forward injection. The drop-out is sub-100 mV over various operating PVT conditions. Over 30 dB of PSRR is obtained up to 15 GHz, easing system integration and enhancing link performance. The regulator design permits the use of multiple instantiations to improve noise isolation in the transmitters, receivers and PLL.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A system comprising a SerDes system comprising:
the SerDes system comprising:
a reference clock;
a first communication lane configured to process a first data stream at a first data rate and transmitting a first sampled data stream using an output clock signal, the first data stream being characterized by a first data rate;
a second communication lane configured to process a second data stream at a second data rate and transmitting a second sampled data stream; and
an interface management module configured to provide control signals;
wherein the first communication lane comprises:
a receiver module comprising a sampling module and a PLL and being configured to sample the first data stream, the PLL being configured to generate a predetermined number of phases, the sampling module comprising a first sampling line and a second sampling line, the first sampling line being configured to provide sampling during a first phase of the first data stream at a second data rate, the second sampling line being configured to provdie sampling during a second phase of the first data stream, the second data rate being a fraction of the first data rate;
a FIFO buffer being configured to store sampled data from the receiver module;
a transmission module being configured to transmit the first sampled data stream at a output data rate; and
a network coupled to the SerDes system.

2. The system of claim 1 wherein the FIFO buffer comprises a phase alignment module.

3. The system of claim 1 wherein the FIFO buffer comprises a jitter removal module.

4. The system of claim 1 further comprising an error counter coupled to the output of the receiver module.

5. The system of claim 1 wherein the interface management module comprises MDIO or I2C interface.

6. The system of claim 1 wherein the transmission module comprises an optical communication interface.

7. The system of claim 1 further wherein the PLL is configured to generate a recovered clock signal.

8. The system of claim 1 further wherein the receiver is configured to provide the output clock signal.

9. The system of claim 8 wherein the second data stream is transmitted using the output clock signal.

10. The system of claim 1 further comprising a power supply rejection (PSRR) regulator.

11. The system of claim 1 further comprising a third communication lane and a fourth communication lane.

12. The system of claim 1 wherein the sampling module further comprises four sampling lines, each operating at a quarter of the first data rate.

13. A system comprising a SerDes system comprising:
the SerDes system comprising:
a reference clock;
a first communication lane configured to process a first data stream at a first data rate and transmitting a first sampled data stream using an output clock signal, the first data stream being characterized by a first data rate;
a second communication lane configured to process a second data stream at a second data rate and transmitting a second sampled data stream; and
an interface management module configured to provide control signals;
wherein the first communication lane comprises:
a receiver module comprising a sampling module and a PLL and being configured to sample the first data stream, the PLL being configured to generate a predetermined number of phases, the sampling module comprising a first sampling line and a second sampling line, the first sampling line being configured to provide sampling during a first phase of the first data stream at a second data rate, the second sampling line being configured to provide sampling during a second phase of the first data stream, the second data rate being a fraction of the first data rate, the first sampling line comprises a sense amplifier and a charge pump;
a transmission module being configured to transmit the first sampled data stream at a output data rate; and
a network.

14. The system of claim 13 wherein the receiver module further comprises an equalizer module, the equalizer module comprises two or more CTLEs.

15. The system of claim 13 wherein the receiver module further comprises an auto-zero DAC.

16. The system of claim 13 wherein the first sample line and the second sample line are aligned at predetermined sampling positions.

17. The system of claim 13 wherein the receiver further comprises a voltage controlled oscillator (VCO).

18. The system of claim 13 wherein the receiver further comprises a loop filter coupled to an output of the sampling module.

19. A system comprising a SerDes system comprising:
the SerDes system comprising:
a first communication lane configured to process a first data stream at a first data rate and transmitting a first sampled data stream using an output clock signal, the first data stream being characterized by a first data rate;
a second communication lane configured to process a second data stream at a second data rate and transmitting a second sampled data stream; and
an interface management module configured to provide control signals;
wherein the first communication lane comprises:
a receiver module comprising a sampling module and a PLL and being configured to sample the first data stream, the PLL being configured to generate a predetermined number of phases, the sampling module comprising a first sampling line and a second sampling line, the first sampling line being configured to provide sampling the first data stream at a second data rate, the second sampling line being configured to provide sampling during a second phase of the first data stream, the second data rate being a fraction of the first data rate, the first sampling line comprises a sense amplifier and a charge pump, the first sampling line and the second sampling line being time-interleaved based on a predetermined alignment, the PLL being configured to provide a recovered clock signal based at least on the first data stream;
a transmission module being configured to transmit the first sampled data stream at a output data rate; and
a network coupled to the SerDes system.

20. The system of claim 19 wherein the receiver further comprises a DEMUX module, the DEMUX module being coupled to the sense amplifier and the PLL.

* * * * *